United States Patent
Fujita et al.

(10) Patent No.: US 6,172,485 B1
(45) Date of Patent: Jan. 9, 2001

(54) POWER SUPPLY MONITORING INTEGRATED CIRCUIT DEVICE AND BATTERY PACK

(75) Inventors: Hiroyuki Fujita; Koichi Inoue, both of Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/341,686

(22) PCT Filed: Jan. 28, 1998

(86) PCT No.: PCT/JP98/00379

§ 371 Date: Jun. 22, 1999

§ 102(e) Date: Jun. 22, 1999

(87) PCT Pub. No.: WO98/34316

PCT Pub. Date: Aug. 6, 1998

(30) Foreign Application Priority Data

Jan. 30, 1997 (JP) .................................................. 9-016161

(51) Int. Cl.⁷ ............................. H02J 7/00; G01N 27/416
(52) U.S. Cl. ........................ 320/136; 320/134; 320/118; 324/433
(58) Field of Search ................................. 320/136, 134, 320/118, 120, 162; 324/433

(56) References Cited

U.S. PATENT DOCUMENTS 5,652,501 * 7/1997 McClure et al. ..................... 340/636
5,929,603 * 7/1999 Nakao et al. ......................... 320/136
6,020,718 * 2/2000 Ozawa et al. ........................ 320/116

FOREIGN PATENT DOCUMENTS 5-336674   12/1993   (JP) .
8-79978     3/1996   (JP) .

* cited by examiner

*Primary Examiner*—Peter S. Wong
*Assistant Examiner*—Gregory J. Toatley, Jr.
(74) *Attorney, Agent, or Firm*—Arent Fox Kitner Plotkin & Kahn, PLLC

(57) ABSTRACT

A power supply controlling integrated circuit device have detection input terminals for receiving the voltages of a plurality of cells and a plurality of comparing means for comparing the voltages of the individual cells with a predetermined reference voltage. To control discharging or charging of the cells in accordance with the outputs of the comparing means, a mode terminal is provided for receiving a signal for designating the number of cells. Also provided are a first circuit that can forcibly bring part of the comparing means into a predetermined output state in accordance with the signal received at the mode terminal and a second circuit for excluding from monitoring the outputs of those comparing means which have been brought into the predetermined output state. This enables the power supply monitoring integrated circuit device to control different numbers of cells without requiring any separately-mounted component or the like.

6 Claims, 5 Drawing Sheets

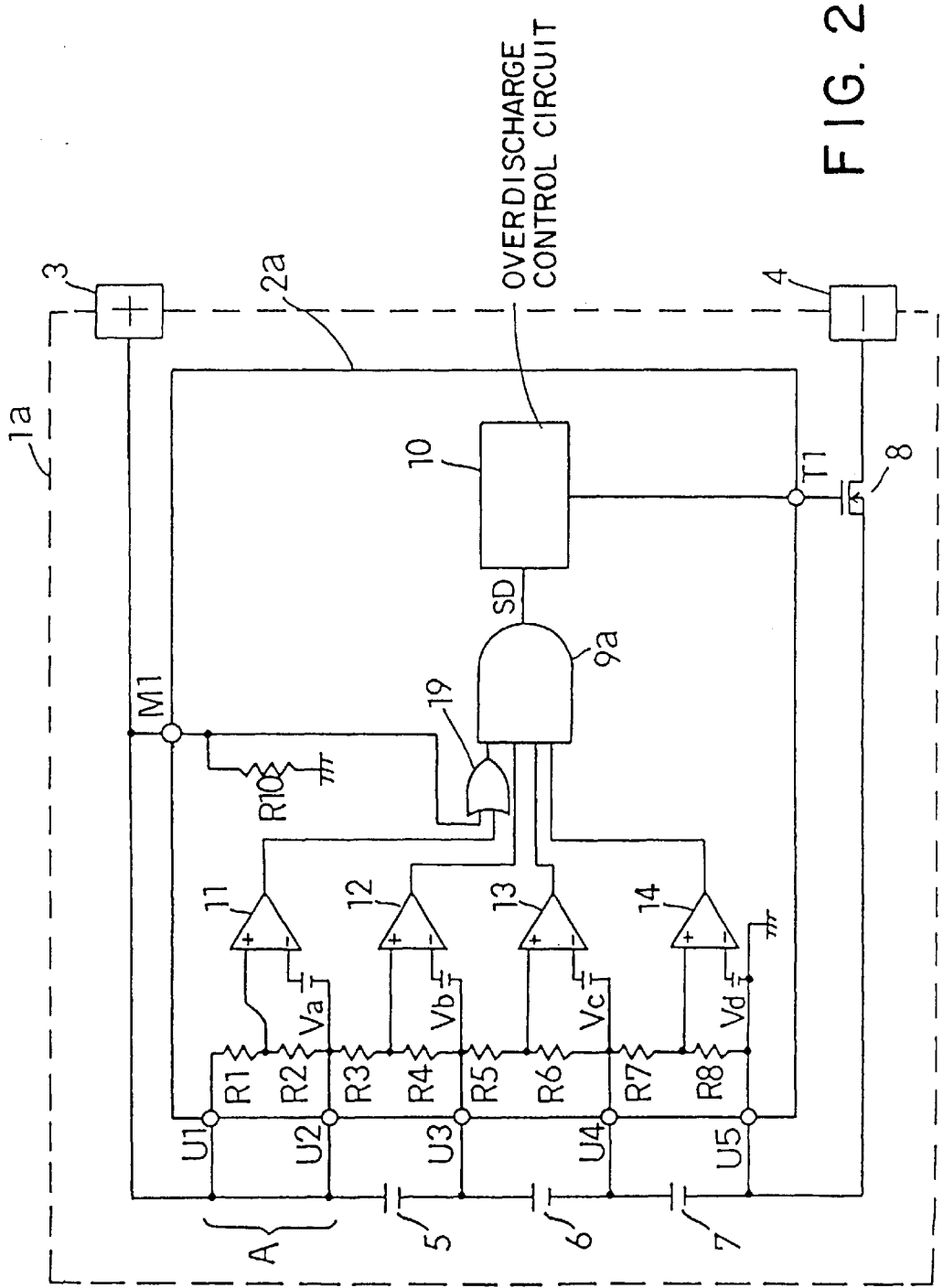
F I G. 2

US 6,172,485 B1

POWER SUPPLY MONITORING INTEGRATED CIRCUIT DEVICE AND BATTERY PACK

TECHNICAL FIELD

The present invention relates to a power supply monitoring integrated circuit device (hereafter a "power supply monitoring IC") for monitoring the voltage of a lithium-ion battery or the like so as to control discharging and charging of the battery.

BACKGROUND ART

A conventional power supply monitoring IC will be described with reference to FIGS. 4 and 5. FIG. 4 is a circuit diagram of a lithium-ion power supply apparatus (hereafter a "battery pack") 1b for controlling discharging and charging of three-stage lithium-ion cells 5 to 7. The lithium-ion cells 5 to 7, if brought into an overdischarged state, suffer deterioration of characteristics, and therefore the battery pack 1b, by the use of a power supply monitoring IC 2b, monitors the voltage of the individual cells 5 to 7 to prevent them from being brought into an overdischarged state.

The cells 5 to 7 are connected in series in this order from the highest potential end. The higher potential end of the cell 5 is connected to a detection input terminal U1 of the power supply monitoring IC 2b and to a positive terminal 3 of the battery pack 1b. The lower potential end of the cell 7 is connected to an input terminal U4 and to the drain of an N-channel MOSFET (metal-oxide semiconductor field-effect transistor) 8.

The source of the MOSFET 8 is connected to the negative terminal 4 of the battery pack 1b. The gate of the MOSFET 8 is connected to a terminal T1, and, via this terminal T1, the MOSFET 8 receives an ON/OFF control signal from the power supply monitoring IC 2b. The node between the cells 5 and 6 is connected to an input terminal U2. The node between the cells 6 and 7 is connected to an input terminal U3.

Within the power supply monitoring IC 2b, resistors R1 and R2 are connected in series between the terminals U1 and U2. Similarly, resistors R3 and R4 are connected in series between the terminals U2 and U3, and resistors R5 and R6 are connected in series between the terminals U3 and U4. The terminal U4 is connected to ground.

The node between the resistors R1 and R2 is connected to the non-inverting input terminal (+) of a comparator 11. To the inverting input terminal (−) of the comparator 11, a voltage higher than the voltage at the terminal U2 by a reference voltage Va is fed. The node between the resistors R3 and R4 is connected to the non-inverting input terminal (+) of a comparator 12. To the inverting input terminal (−) of the comparator 12, a voltage higher than the voltage at the terminal U3 by a reference voltage Vb is fed. The node between the resistors R5 and R6 is connected to the non-inverting input terminal (+) of a comparator 13. To the inverting input terminal (−) of the comparator 13, a voltage higher than the ground voltage by a reference voltage Vc is fed. The values of the reference voltages Va, Vb, and Vc are identical.

The outputs of the comparators 11 to 13 are fed to an AND circuit 9b. The AND circuit 9b outputs a logical product signal SD, which is fed to an overdischarge control circuit 10. In accordance with this signal SD, the overdischarge control circuit 10 turns on and off the MOSFET 8, which is connected to the terminal T1.

The comparators 11 to 13 individually check whether the voltages of the cells 5 to 7 are higher than a predetermined overdischarge voltage or not. The overdischarge voltage is set, for example, at 2.2 V. If the voltages of all of the cells 5 to 7 are higher than the overdischarge voltage, the AND circuit 9b outputs a high level as the signal SD. By contrast, if the voltage of any of the cells 5 to 7 is lower than the overdischarge voltage, the AND circuit 9b outputs a low level as the signal SD.

When the signal SD is at a high level, the overdischarge control circuit 10 keeps the MOSFET 8 on so that electric power is supplied to the device (not shown), such as a personal computer, connected to the terminals 3 and 4. By contrast, when the signal SD turns to a low level, the overdischarge control circuit 10 turns off the MOSFET 8 to inhibit the discharging of the cells 5 to 7.

FIG. 5 shows another example of a conventional battery pack 1c having a configuration different from that of the conventional battery pack (FIG. 4) described above. Here, for cells 5 to 7, a plurality of detection circuits 30 to 32 are used in combination. The detection circuits 30 to 32 are configured identically, and are formed, for example, within a single integrated circuit.

Within each of the detection circuits 30 to 32, resistors R1 and R2 are connected in series between terminals U1 and U2. The node between the resistors R1 and R2 is connected to the non-inverting input terminal (+) of a comparator 35. To the inverting input terminal (−) of the comparator 35, a voltage higher than the voltage at the terminal U2 by a reference voltage Va is fed. The result of the comparison performed by the comparator 35 is fed out via a terminal T0.

The signals output via the terminal T0 of the individual detection circuits 30 to 32 are fed to an AND circuit 36. In response, the AND circuit 36 outputs a signal SD, which is fed to an overdischarge control circuit 34. When the signal SD is at a high level, the overdischarge control circuit 34 keeps a MOSFET 8 on; by contrast, when the signal SD turns to a low level, the overdischarge control circuit 34 turns off the MOSFET 8. In this way, the same overdischarge control is achieved as achieved by the circuit shown in FIG. 4. Note that, in FIG. 5, such elements as are found also in FIG. 4 are identified with the same reference numerals and symbols, and overlapping descriptions will not be repeated.

However, in the first conventional example, the power supply monitoring IC 2b (FIG. 3) can only cope with three-stage cells 5 to 7. That is, different power supply monitoring ICs are required to cope with different numbers of stages of cells. This means that different power supply monitoring ICs need to be manufactured for different numbers of stages of cells. This complicates management of power supply monitoring ICs and the like, and lengthens the time required for evaluation, designing, and the like of battery packs and the like.

On the other hand, the second conventional example permits flexible connection in accordance with the number of stages of cells, as shown in FIG. 5. However, to perform an AND operation on the signals output from the detection circuits 30 to 32, it is necessary to use an additional component 33 that needs to be mounted separately. This demands extra costs.

DISCLOSURE OF THE INVENTION

An object of the present invention is to provide a power supply monitoring IC that can control different numbers of cells without requiring any separately-mounted component or the like, and to provide a battery pack employing such a power supply monitoring IC.

To achieve the above object, in one configuration according to the present invention, a power supply monitoring IC, having input terminals for receiving the voltages of a plurality of cells and a plurality of comparing means for comparing the voltages of the individual cells with a predetermined reference voltage, for controlling discharging or charging of the cells in accordance with the outputs of the comparing means is characterized by being provided with a mode terminal for receiving a signal for designating the number of cells that are controlled by the power supply monitoring IC, a first circuit that can forcibly bring part of the comparing means into a predetermined output state in accordance with the signal received at the mode terminal, and a second circuit for excluding from monitoring the outputs of those comparing means which have been brought into the predetermined output state.

According to this configuration, the power supply monitoring IC compares the voltages of the individual cells with a predetermined voltage such as an overdischarge voltage by means of comparing means such as comparators. For example, when the voltage of a cell is higher than the overdischarge voltage, the corresponding comparator outputs a high level, and, when the voltage of a cell is lower than the overdischarge voltage, the corresponding comparator outputs a low level. The outputs of the individual comparators are fed to an AND circuit, which thus outputs a high level when the voltages of all of the cells are higher than the overdischarge voltage and outputs a low level when the voltage of any of the cells is lower than the overdischarge voltage. When the AND circuit outputs a low level, the power supply monitoring IC inhibits the discharging of the cells by means of a switching device such as a MOSFET.

By feeding in, via the mode terminal, a signal that designates, by means of a high-level or low-level voltage, the number of cells, it is possible to force that part of the comparators which need to be excluded from monitoring to output a high level. This allows the AND circuit to perform an AND operation only on the comparison results obtained from the comparators other than those excluded from monitoring. Thus, the power supply monitoring IC controls the cells in accordance with the number of cells designated. Here, the AND circuit corresponds to the second circuit mentioned above. On the other hand, the first circuit is realized as an OR circuit that is connected to a particular comparing means and to the mode terminal so as to receive the output of that particular comparing means and the signal received at the mode terminal.

BRIEF DESCRIPTION OF DRAWINGS

FIG. 2 is a circuit diagram of the battery pack of a second embodiment of the present invention.

BEST MODE FOR CARRYING OUT THE INVENTION

<First Embodiment>

Figure 1:
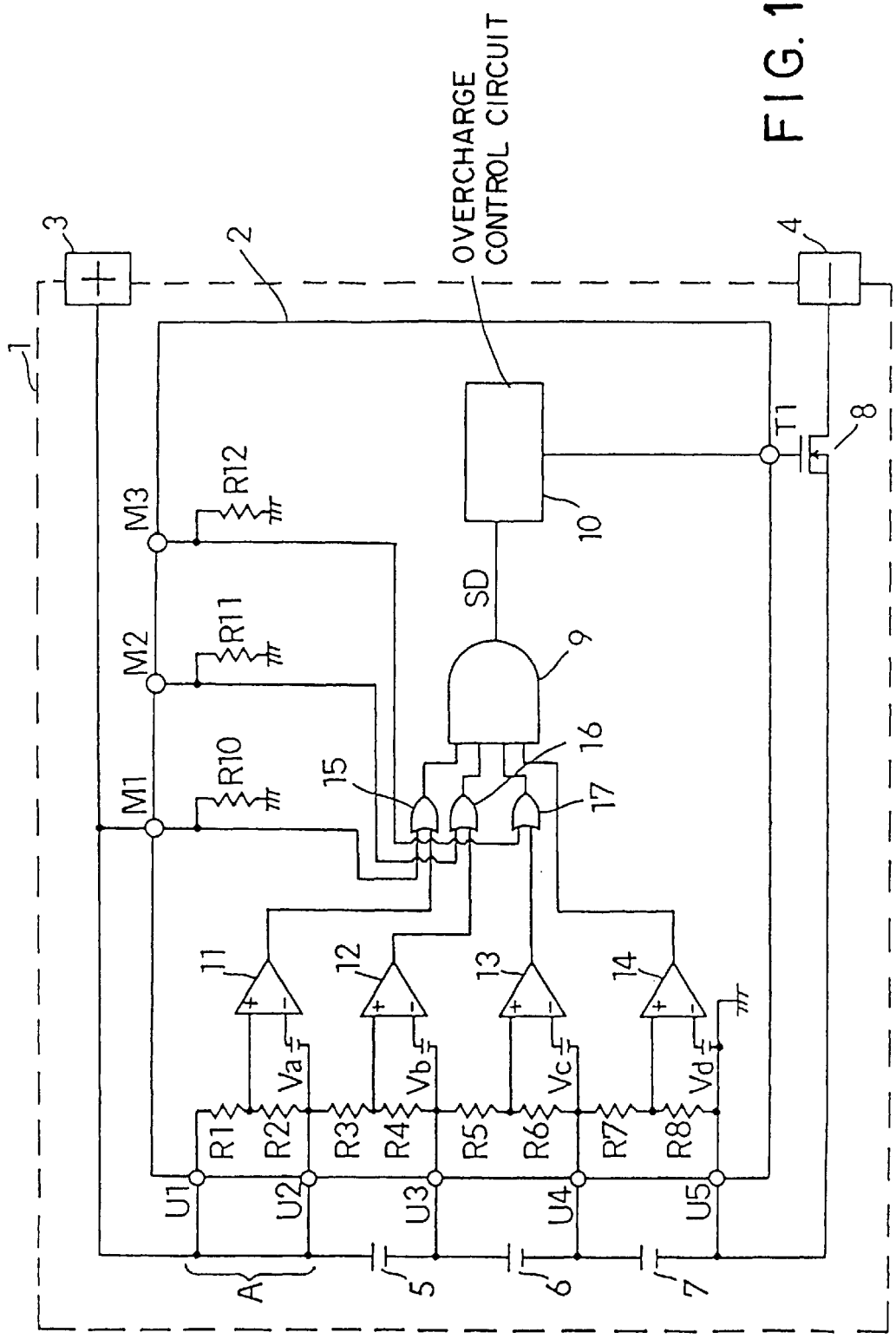
FIG. 1 is a circuit diagram of the battery pack of a first embodiment of the present invention.
Figure 4:
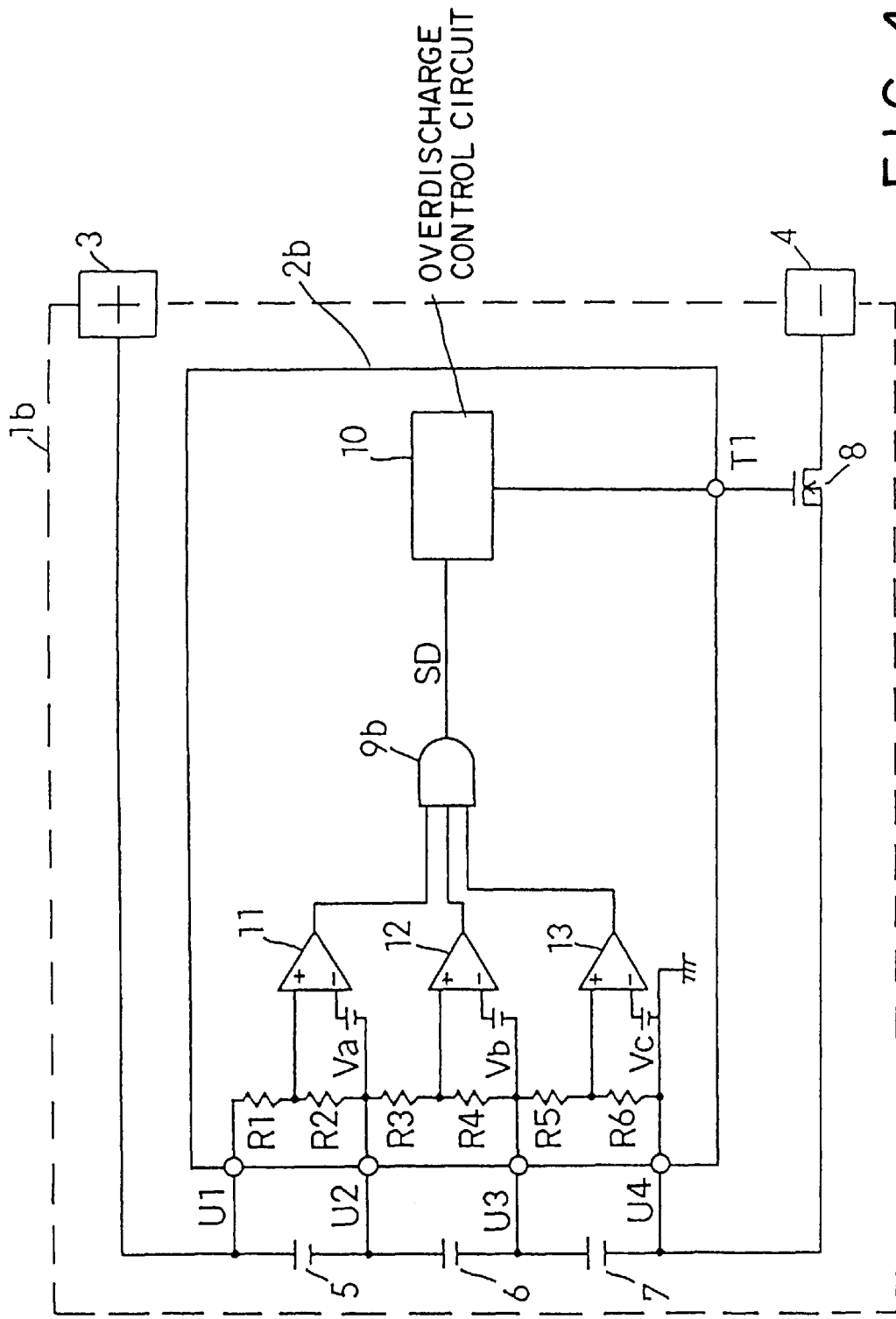
FIG. 4 is a circuit diagram of an example of a battery pack employing a conventional power supply monitoring IC.

FIG. 1 is a circuit diagram of a battery pack 1 employing the power supply monitoring IC 2 of a first embodiment of the present invention. Note that, in FIG. 1, such elements as are found also in FIG. 4 are identified with the same reference numerals and symbols, and overlapping descriptions will not be repeated. The power supply monitoring IC 2 is designed to be capable of controlling one-stage to four-stage cells, and, in the example shown in FIG. 1, it controls three-stage cells 5 to 7.

The lithium-ion cells 5 to 7 are connected in series in this order from the highest potential end. The higher potential end of the cell 5 is connected to detection input terminals U1 and U2 and to a positive terminal 3 of the battery pack 1. The lower potential end of the cell 7 is connected to an input terminal U5 and to the drain of a MOSFET 8. The source of the MOSFET 8 is connected to a negative terminal 4.

The gate of the MOSFET 8 is connected to a terminal T1, so that the MOSFET 8 is turned on and off by the power supply monitoring IC 2. The MOSFET 8 acts as a switching device. The node between the cells 5 and 6 is connected to an input terminal U3. The node between the cells 6 and 7 is connected to an input terminal U4. A mode terminal M1 is connected to the higher potential end of the cell 5. Mode terminals M2 and M3 are either left open or grounded.

In the power supply monitoring IC 2, resistors R1 and R2 are connected in series between the input terminals U1 and U2. Resistors R3 and R4 are connected in series between the input terminals U2 and U3. Resistors R5 and R6 are connected in series between the input terminals U3 and U4. Resistors R7 and R8 are connected in series between the input terminals U4 and U5. The input terminal U5 is connected to ground.

The node between the resistors R1 and R2 is connected to the non-inverting input terminal (+) of a comparator 11. To the inverting input terminal (−) of the comparator 11, a voltage higher than the voltage at the input terminal U2 by a reference voltage Va is fed. The node between the resistors R3 and R4 is connected to the non-inverting input terminal (+) of a comparator 12. To the inverting input terminal (−) of the comparator 12, a voltage higher than the voltage at the input terminal U3 by a reference voltage Vb is fed.

The node between the resistors R5 and R6 is connected to the non-inverting input terminal (+) of a comparator 13. To the inverting input terminal (−) of the comparator 13, a voltage higher than the voltage at the input terminal U4 by a reference voltage Vc is fed. The node between the resistors R7 and R8 is connected to the non-inverting input terminal (+) of a comparator 14. To the inverting input terminal (−) of the comparator 14, a voltage higher than the ground level by a reference voltage Vd is fed. The outputs of the comparators 11 to 14 are fed to an AND circuit 9. Note however that unused-output processing circuits 15 to 17 are inserted on the output side of the comparators 11 to 13, respectively. The values of the reference voltages Va, Vb, Vc, and Vd are identical.

The unused-output processing circuits 15 to 17 are connected to the mode terminals M1 to M3, respectively. The unused-output processing circuits 15 to 17 are OR circuits that respectively receive the outputs of the comparators 11 to 13 and the voltage levels at the mode terminals M1 to M3 so as to be capable of forcing the comparators 11 to 13 individually to output a high level. The terminals M1 to M3 are also connected through resistors R10 to R12 to ground.

The unused-output processing circuit 15, when it receives a high level from the mode terminal M1, outputs a high-level signal to force the comparator 11 to output a high level. On the other hand, the unused-output processing circuits 16 and 17, since they receive a low level from the mode terminals M2 and M3, respectively, feed the signals output from the comparators 12 and 13 intact to the AND circuit 9.

The portion indicated by A is left unused by any cell, and is short-circuited. This makes the comparator 11 output a low level, but the high level from the mode terminal M1 causes the unused-output processing circuit 15 to feed a high-level signal to the AND circuit 9. As a result, the AND circuit 9 performs an AND operation on the results of comparison between the voltages of the cells 5 to 7 and the overdischarge voltage. When the voltages of all of the cells 5 to 7 are higher than the overdischarge voltage, the AND circuit 9 outputs a high level as a logical product signal SD. By contrast, when the voltage of any of the cells 5 to 7 drops below the overdischarge voltage, the AND circuit 9 outputs a low level as the logical product signal SD.

When the signal SD is at a high level, an overdischarge control circuit 10 keeps the MOSFET 8, which is connected to the input terminal T1, on so that electric power is supplied to the device (not shown), such as a personal computer, connected to the positive and negative terminals 3 and 4. By contrast, when the signal SD turns to a low level, the overdischarge control circuit 10 turns off the MOSFET 8 to inhibit the discharging of the cells 5 to 7.

In this way, logical consistency is maintained even when there is a portion A left unused by any cell, and this enables the power supply monitoring IC 2 to control three-stage cells 5 to 7. Specifically, in this case, the unused-output processing circuit 15 forces the comparator 11 to output a high level, and thus the AND circuit 9 and the overdischarge control circuit 10 exclude the output of the comparator 11 from monitoring.

When a cell is additionally inserted in the unused portion A so that four-stage cells are controlled, one has only to make the mode terminal M1 open to keep it grounded. This causes the unused-output processing circuit 15 to stop outputting a high level signal, and thus causes the output of the comparator 11 to be fed intact to the AND circuit 9. In cases where one-stage or two-stage cells are controlled, it is possible to select the appropriate number of stages of cells by applying a high-level voltage to appropriate ones of the mode terminals M1 to M3 and short-circuiting the portions to be left unused between the input terminals U1 to U4, and thereby it is possible to control the discharge state of the cells appropriately in accordance with the number of stages of cells thus selected. Note that, since there is no possibility that the number of cells monitored by the power supply monitoring IC 2 becomes zero, the number of mode terminals M1 to M3 equals (the number of cells—1).

As described above, according to this embodiment, a single power supply monitoring IC 2 can control one-stage to four-stage cells, and thus it is possible to use the same power supply monitoring IC 2 with different numbers of stages of cells. This facilitates management of power supply monitoring ICs and the like. Since there is no need to manufacture different power supply monitoring ICs for different numbers of stages of cells, it is possible to shorten the time required for evaluation, designing, and the like of battery packs. The reliability of control is maintained irrespective of the number of cells actually controlled by the power supply monitoring IC 2. Moreover, it is possible to control one-stage to four-stage cells without using any separately-mounted component 33 or the like as is required in the conventional battery pack 1c (see FIG. 5) described earlier.

When the cells 5 to 7 are subjected to overcharging or overcurrent, there is a risk of smoking or the like. For this reason, it is also possible to provide the power supply monitoring IC 2 with a function for preventing overcharging and overcurrent, as will be described below. To detect overcharging, comparators are used, just as for the detection of an overdischarge voltage, to check whether the voltages of the individual cells 5 to 7 are higher than a predetermined overcharge voltage or not. The overcharge voltage is set, for example, at 4.3 V. When the voltage of any of the cells 5 to 7 is higher than the overcharge voltage, another MOSFET (not shown) that is connected in series with the cells 5 to 7 is turned off to inhibit the charging of the cells 5 to 7.

To detect overcurrent, a circuit element, such as the MOSFET 8, that is connected in series with the cells 5 to 7 is used to monitor the voltage drop across that circuit element and thereby monitor the current flowing therethrough. When the monitored current is greater than a predetermined value, another MOSFET (not shown) that is connected in series with the cells 5 to 7 is turned off to inhibit the use of the cells 5 to 7.

The power supply monitoring IC 2 of this embodiment can control four-stage cells at most; however, by adding similar circuits thereto, it can be designed to control any number of stages of cells at most. The MOSFET 8 may be replaced with a switching device of any other type. The overdischarge voltage may be set at any voltage other than 2.2 V. The overcharge voltage may be set at any voltage other than 4.3 V. Unused-output processing circuits may be provided one for each of the comparators so that the comparators are individually controlled by the outputs of the unused-output processing circuits.

<Second Embodiment>

A second embodiment of the present invention will be described with reference to FIG. 2. FIG. 2 is a circuit diagram of a battery pack 1a that controls three-stage cells 5 to 7 by using a power supply monitoring IC 2a designed to control three- or four-stage cells.

The lithium-ion cells 5 to 7 are connected in series in this order from the highest potential end. The higher potential end of the cell 5 is connected to input terminals U1 and U2 of the power supply monitoring IC 2a and to a positive terminal 3 of the battery pack 1a. The lower potential end of the cell 7 is connected to an input terminal U5 and to the drain of a MOSFET 8. The source of the MOSFET 8 is connected to a negative terminal 4.

The gate of the MOSFET 8 is connected to a terminal T1, so that the MOSFET 8 is turned on and off by the power supply monitoring IC 2a. The node between the cells 5 and 6 is connected to an input terminal U3. The node between the cells 6 and 7 is connected to an input terminal U4. A mode terminal M1 is connected to the higher potential end of the cell 5.

Within the power supply monitoring IC 2a, resistors R1 and R2 are connected in series between the input terminals U1 and U2. Resistors R3 ad R4 are connected in series between the input terminals U2 and U3. Resistors R5 and R6 are connected in series between the input terminals U3 and U4. Resistors R7 and R8 are connected in series between the input terminals U4 and U5. The input terminal U5 is connected to ground.

The node between the resistors R1 and R2 is connected to the non-inverting input terminal (+) of a comparator 11. To the inverting input terminal (−) of the comparator 11, a voltage higher than the voltage at the input terminal U2 by a reference voltage Va is fed. The node between the resistors R3 and R4 is connected to the non-inverting input terminal (+) of a comparator 12. To the inverting input terminal (−)

of the comparator 12, a voltage higher than the voltage at the input terminal U3 by a reference voltage Vb is fed.

The node between the resistors R5 and R6 is connected to the non-inverting input terminal (+) of a comparator 13. To the inverting input terminal (−) of the comparator 13, a voltage higher than the voltage at the input terminal U4 by a reference voltage Vc is fed. The node between the resistors R7 and R8 is connected to the non-inverting input terminal (+) of a comparator 14. To the inverting input terminal (−) of the comparator 14, a voltage higher than the ground level by a reference voltage Vd is fed. The outputs of the comparators 11 to 14 are fed to an AND circuit 9a.

A cell mode switching circuit 19 is connected to the terminal M1. This switching circuit 19 switches the operation mode in accordance with a high-level or low-level signal fed in via the terminal M1. The switching circuit 19 is an OR circuit that can force the comparator 11 to output a high level when the terminal M1 is at a high level. FIG. 2 shows the state of a three-cell mode (for three-stage cells). In this mode, the terminal M1 is connected to a higher potential end of the cell 5 so that a high level is fed to the switching circuit 19. In a four-cell mode (for four-stage cells), the terminal M1 is either left open or grounded. The terminal M1 is grounded through a resistor R10.

In the three-cell mode, the input terminals U1 and U2 are short-circuited, and therefore the comparator 11 outputs a low level. However, the switching circuit 19 feeds a signal to the AND circuit 9a, and, for example, the AND circuit 9a forcibly turns the output of the comparator 11 to a high level as described above. As a result, an AND operation is performed on the signals output from the comparators 12 to 14.

Thus, the AND circuit 9a compares the voltages of the cells 5 to 7 with an overdischarge voltage, and outputs a signal SD to an overdischarge control circuit 10. In accordance with the signal SD, the overdischarge control circuit 10 turns on and off the MOSFET 8 connected to the terminal Ti. In the three-cell mode, the AND circuit 9a and the overdischarge control circuit 10 exclude the output of the comparator 11 from monitoring.

For example, some notebook-type personal computers require either three- or four-stage cells depending on the type of their CPU (central processing unit). The power supply monitoring ICs 2 and 2a of the embodiments described heretofore can be used in either case. In this way, these power supply monitoring ICs are usable in a wider range of applications. In both of the first and second embodiments described above, the operation mode is switched by feeding a high-level or low-level voltage to the mode terminals; however, it is also possible to switch the operation mode, for example, in accordance with the number of pulses included in a pulse signal fed thereto as a predetermined switching signal.

<Third Embodiment>

Figure 3:
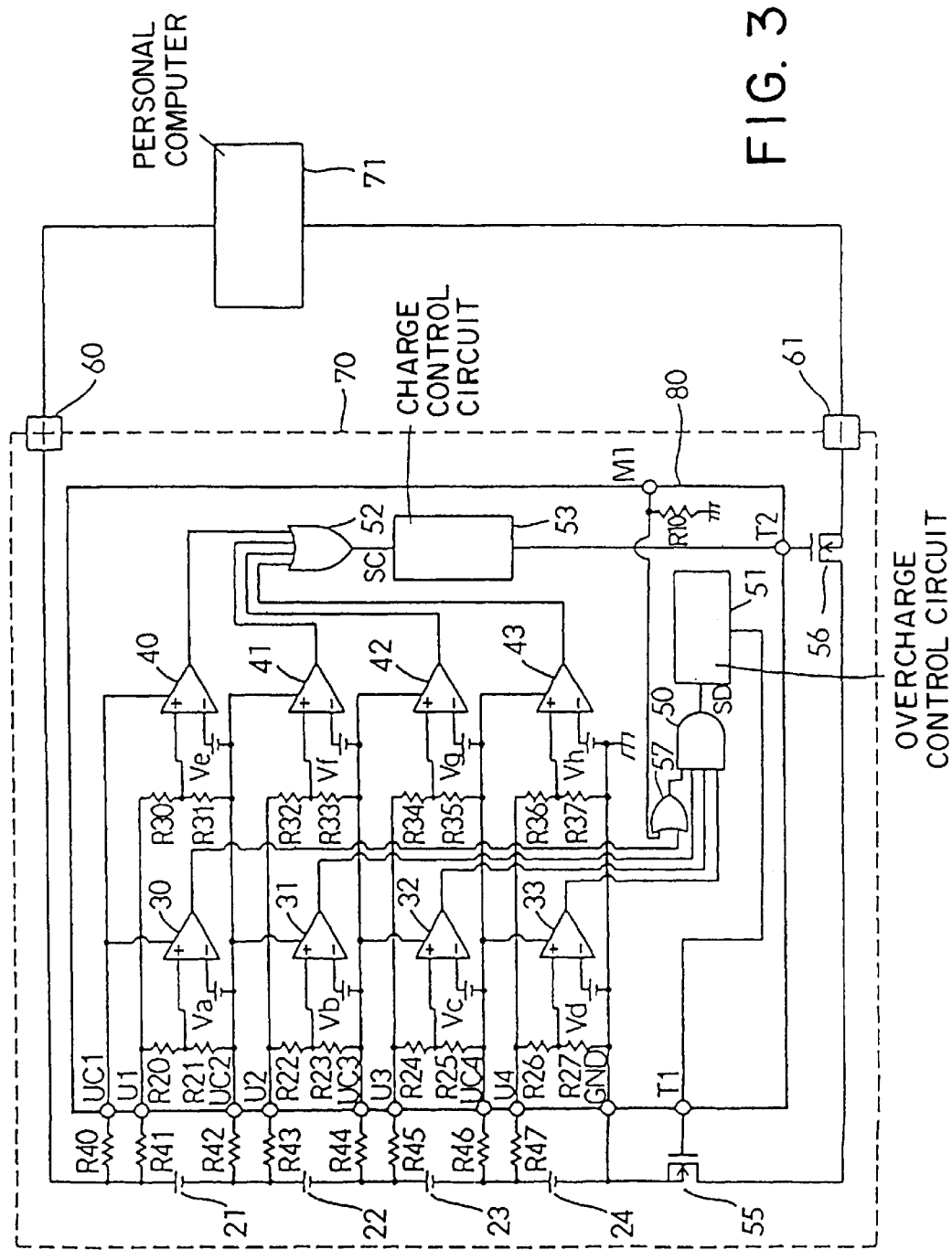
FIG. 3 is a circuit diagram of the battery pack of a third embodiment of the present invention.

A third embodiment of the present invention will be described with reference to FIG. 3. FIG. 3 is a block diagram of a battery pack 70 employing a power supply monitoring IC 80 that can detect overdischarging and overcharging. The power supply monitoring IC 80 monitors the state of four lithium-ion cells 21 to 24 individually to prevent overdischarging and overcharging.

The cells 21 to 24 are connected in series in this order from the highest potential end. The higher potential end of the cell 21 is connected to a positive terminal 60 of the battery pack 70, and the lower potential end of the cell 24 is connected to the drain of an N-channel MOSFET 55 provided for discharge control. The source of the MOSFET 55 is connected to the drain of an N-channel MOSFET 56 provided for charge control. The gate of the MOSFET 55 is connected to a terminal T1 of the power supply monitoring IC 80.

The source of the MOSFET 56 is connected to a negative terminal 61 of the battery pack 70, and the gate of the MOSFET 56 is connected to a terminal T2 of the power supply monitoring IC 80. As will be described later, the MOSFETs 55 and 56 are turned on and off by the power supply monitoring IC 80. Through discharging, electric power is supplied to a personal computer 71 connected to the terminals 60 and 61.

A power supply terminal UC1 for supplying electric power to a comparator described later is connected through a protection resistor R40 to the higher potential end of the cell 21. Note that protection resistors R40 to R47 have a resistance of about 1 kΩ and serve to prevent infiltration of noise into the power supply monitoring IC 73 which may result in electrostatic destruction. A voltage detection terminal U1 is connected through the protection resistor R41 to the higher potential end of the cell 21. Intermediate terminals are provided as follows. A power supply terminal UC2 is connected through the protection resistor R42 to the node between the cells 21 and 22. A voltage detection terminal U2 is connected through the protection resistor R43 to the node between the cells 21 and 22.

A power supply terminal UC3 is connected through the protection resistor R44 to the node between the cells 22 and 23. A voltage detection terminal U3 is connected through the protection resistor R45 to the node between the cells 22 and 23. A power supply terminal UC4 is connected through the protection resistor R46 to the node between the cells 23 and 24. A voltage detection terminal U4 is connected through the protection resistor R47 to the node between the cells 23 and 24.

The power supply terminals UC1 to UC4 are used to supply electric power to comparators 30 to 33, respectively, and also to comparators 40 to 43, respectively. Between the terminals U1 and UC2, resistors R20 and R21 are connected in series. The voltage at the node between the resistors R20 and R21 is fed to the non-inverting input terminal (+) of the comparator 30. To the inverting input terminal (−) of the comparator 30, a voltage higher than the voltage at the power supply terminal UC2 by a reference voltage Va is fed.

Similarly, between the terminals U2 and UC3, resistors R22 and R23 are connected in series. The voltage at the node between the resistors R22 and R23 is fed to the non-inverting input terminal (+) of the comparator 31. To the inverting input terminal (−) of the comparator 31, a voltage higher than the voltage at the power supply terminal UC3 by a reference voltage Vb is fed.

Similarly, between the terminals U3 and UC4, resistors R24 and R25 are connected in series. The voltage at the node between the resistors R24 and R25 is fed to the non-inverting input terminal (+) of the comparator 32. To the inverting input terminal (−) of the comparator 32, a voltage higher than the voltage at the power supply terminal UC4 by a reference voltage Vc is fed.

Similarly, between the terminals U4 and GND, resistors R26 and R27 are connected in series. The voltage at the node between the resistors R26 and R27 is fed to the non-inverting input terminal (+) of the comparator 33. The terminal GND is grounded so as to be at the ground level. To the inverting input terminal (−) of the comparator 33, a voltage higher than the ground level by a reference voltage Vd is fed.

The resistances of the resistors R20, R22, R24, and R26 are identical, for example 3 MΩ. The resistances of the resistors R21, R23, R25, and R27 are identical, for example 1 MΩ. The reference voltages Va to Vd are identical. The comparators 30 to 33 compare the voltages of the cells 21 to 24, respectively, with an overdischarge voltage. The overdischarge voltage is set, for example, at 2.2 V.

The outputs of the comparators 30 to 33 are fed to an AND circuit 50. Note however that an OR circuit 57 is inserted on the output side of the comparator 30, with the other input terminal of the OR circuit 57 connected to a mode terminal M1. The mode terminal M1 is grounded through a resistor R10. Thus, when the voltages of all of the cells 21 to 24 are higher than the overdischarge voltage, the AND circuit 50 outputs a signal SD. The output of the AND circuit 50 is fed to an overdischarge control circuit 51. When the signal SD is fed to the overdischarge control circuit 51, the overdischarge control circuit 51 applies a voltage to the gate of the MOSFET 55 connected to the terminal Ti to turn on the MOSFET 55.

By contrast, when the voltage of at least one of the cells 21 to 24 drops below the overdischarge voltage, the AND circuit 50 stops outputting the signal SD, and thus the overdischarge control circuit 51 turns off the MOSFET 55. In this way, during discharging, the power supply monitoring IC 80 monitors the state of the cells 21 to 24 to prevent overdischarging.

On the other hand, during charging, the power supply monitoring IC 80 monitors the state of the cells 21 to 24 to prevent overcharging. Between the terminals U1 and UC, resistors R30 and R31 are connected in series. The voltage at the node between the resistors R30 and R31 is fed to the non-inverting input terminal (+) of the comparator 40. To the inverting input terminal (−) of the comparator 40, a voltage higher than the voltage at the terminal UC2 by a reference voltage Ve is fed. Thus, the comparator 40 outputs a high level when the voltage of the cell 21 is higher than a predetermined overcharge voltage, and outputs a low level when the voltage of the cell 21 is lower than the overcharge voltage. The overcharge voltage is set, for example, at 4.3 V.

Similarly, between the terminals U2 and UC3, resistors R32 and R33 are connected in series. The voltage at the node between the resistors R32 and R33 is fed to the non-inverting input terminal (+) of the comparator 41. To the inverting input terminal (−) of the comparator 41, a voltage higher than the voltage at the terminal UC3 by a reference voltage Vf is fed.

Similarly, between the terminals U3 and UC4, resistors R34 and R35 are connected in series. The voltage at the node between the resistors R34 and R35 is fed to the non-inverting input terminal (+) of the comparator 42. To the inverting input terminal (−) of the comparator 42, a voltage higher than the voltage at the power supply terminal UC4 by a reference voltage Vg is fed.

Similarly, between the terminals U4 and GND, resistors R36 and R37 are connected in series. The voltage at the node between the resistors R36 and R37 is fed to the non-inverting input terminal (+) of the comparator 43. To the inverting input terminal (−) of the comparator 43, a voltage higher than the ground level by a reference voltage Vh is fed.

The outputs of the comparators 40 to 43 are fed to an OR circuit 52. Thus, when the voltage of at least one of the cells 21 to 24 is higher than the overcharge voltage, the OR circuit 52 outputs a high level. By contrast, when the voltages of all of the cells 21 to 24 are lower than the overcharge voltage, the OR circuit 52 outputs a low level. The output (the signal SC) of the OR circuit 52 is fed to a charge control circuit 53.

The charge control circuit 53, when it is not receiving a high-level signal SC, applies a voltage to the gate of the MOSFET 56 connected to the terminal T2 to turn on the MOSFET 56. By contrast, the charge control circuit 53, when it receives a low-level signal SC, turns on the MOSFET 56. In this way, while the cells 21 to 24 are charged via the terminals 60 and 61, the state of the cells 21 to 24 is monitored to check whether the voltages of the individual cells 21 to 24 are higher than the overcharge voltage or not, so that, if the voltage of any of the cells 21 to 24 is higher than the overcharge voltage, the MOSFET 56 is turned off to inhibit the charging.

By the use of the power supply monitoring IC 80 of this embodiment, it is possible to monitor the state of four serially connected lithium-ion cells 21 to 24 to prevent overdischarging and overcharging. Since the resistors R20 to R27 ensure a high impedance, almost no current flows at the voltage detection terminals U1 to U4. This helps minimize the voltage drops across the protection resistors R41, R43, R45, and R45 and across wiring resistances, and thereby minimize detection errors.

Even if a disconnection occurs because of improper soldering at the intermediate terminals U2 to U4 and UC2 to UC4, the disconnection does not affect the other terminals, and therefore does not cause a wrong judgment. Thus, even in such a case, the power supply monitoring IC 80 turns off the MOSFET 55 and thereby prevents the cells 21 to 24 from being brought into an overdischarged state. Similarly, the comparators 40 to 43 for detecting an overcharge voltage do not make a wrong judgment. When three cells are monitored, the terminals for connecting the cell 21 are short-circuited, and the mode terminal M1 is connected to the higher potential end of the cells 22 to 24. This makes it possible to monitor three cells 22 to 24 as described previously.

When the lithium-ion cells 21 to 24 are subjected to overcurrent, there is a risk of smoking or the like. For this reason, it is also possible to provide the power supply monitoring IC 80 with a function for preventing overcurrent. For example, by exploiting the on-state resistance of the MOSFET 55 or the like, the current flowing therethrough is converted into a voltage so that, when the detected voltage indicates overcurrent, the MOSFET 55 is turned off.

Figure 5:
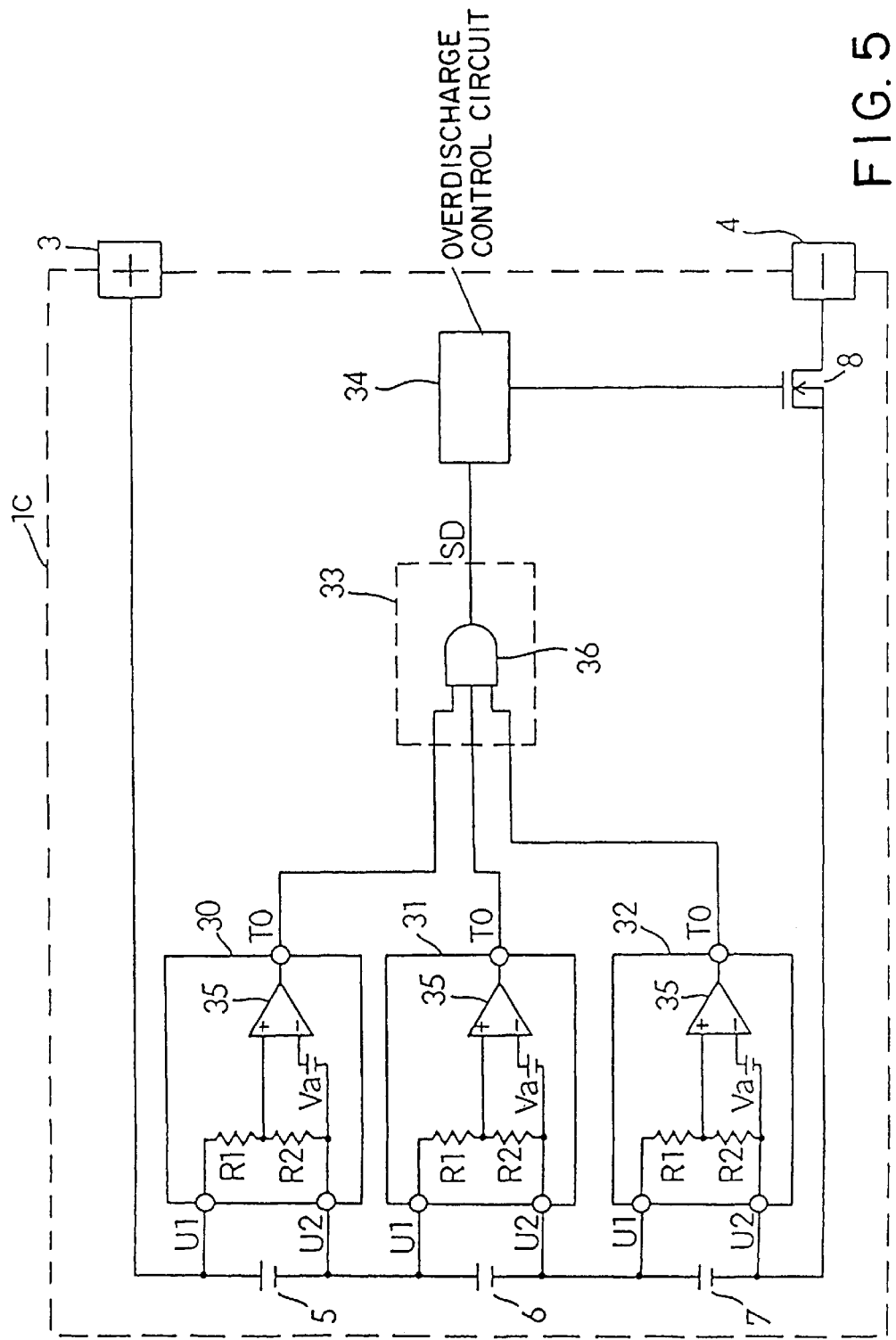
FIG. 5 is a circuit diagram of another example of a battery pack employing a conventional power supply monitoring IC.

As shown in FIG. 5, the power supply monitoring IC 80 employs the same circuit configuration for each of the cells 21 to 24, and therefore can be designed to monitor any number, like 2, 3, . . . , of cells. For example, a power supply monitoring IC designed to monitor two or three cells can be used in a portable telephone, portable video recorder, or the like; a power supply monitoring IC designed to monitor three or four cells can be used, as shown in FIG. 5, in a personal computer 71, or the like. The battery pack 70 of this embodiment can be used not only in a personal computer 71, but also in an appliance of any other kind.

The MOSFETs 55 and 56 may be inserted anywhere as long as they can, when turned off, inhibit the discharging or charging of the cells 21 to 24. The terminals UC1 and U1 may be provided as a single terminal.

INDUSTRIAL APPLICABILITY

As described above, according to the present invention, it is possible to designate the number of cells that are connected to a power supply monitoring IC simply pulling up or down mode terminals. The power supply monitoring IC compares the voltages of the individual cells with a predetermined voltage by means of comparing means such as comparators, and, in accordance with the designated number of cells, forcibly brings those comparators whose output need to be excluded from monitoring into a predetermined output state. This makes it possible to control different numbers of cells by the use of a single power supply monitoring IC while maintaining reliability and logical consistency. Moreover, it is possible to control the cells without using any separately mounted component or the like. Thus, it is possible to use the same power supply monitoring IC for different numbers of cells, and this facilitates management of components such as power supply monitoring ICs. Moreover, since there is no need to manufacture different power supply monitoring ICs for different numbers of cells, it is possible to shorten the time required for evaluation and designing of battery packs and the like.

As described above, it is possible to control the operation of cells, which may be connected in various ways, by the use of a single power supply monitoring IC without sacrificing reliability of control and without requiring any separately mounted component or the like. Accordingly, the present invention is useful in portable telephones, portable video recorders, and the like that require two or three cells depending on the model, and also in personal computers and the like that require three or four cells.

What is claimed is:

1. A power supply monitoring integrated circuit device, having input terminals for receiving voltages of a plurality of cells and a plurality of comparing means for comparing the voltages of the individual cells with a predetermined reference voltage, for controlling discharging or charging of the cells in accordance with outputs of the comparing means, characterized by being provided with:

a mode terminal for receiving a signal for designating a number of cells that are controlled by the power supply monitoring integrated circuit device;

a first circuit that can forcibly bring part of the comparing means into a predetermined output state in accordance with the signal received at the mode terminal; and a second circuit for excluding from monitoring the outputs of those comparing means which have been brought into the predetermined output state.

2. A power supply monitoring integrated circuit device as claimed in claim 1, characterized in that:

the reference voltage is an overdischarge voltage;

the comparing means each output a first level when the voltage of the corresponding cell is higher than the overdischarge voltage, and output a second level when the voltage of the corresponding cell is lower than the overdischarge voltage; and the second circuit for achieving exclusion from monitoring performs an AND operation on the outputs of the comparing means by means of an AND circuit, and forces part of the comparing means to output a first level in accordance with the signal received at the mode terminal by means of the first circuit for forcibly bringing about a predetermined output state.

3. A power supply monitoring integrated circuit device as claimed in claim 1, characterized in that:

the first circuit is an OR circuit that is connected to a particular comparing means and to the mode terminal so as to receive an output of the particular comparing means and the signal received at the mode terminal; and the second circuit is an AND circuit that receives an output of the OR circuit and outputs of the comparing means other than the particular comparing means.

4. A battery pack having a cell, a switching device connected in series with the cell, and a power supply monitoring integrated circuit device, the switching device being turned on and off in accordance with a result of monitoring by the power supply monitoring integrated circuit device, wherein the power supply monitoring integrated circuit device comprises:

input terminals for receiving voltages of a plurality of cells;

a plurality of comparing means for comparing the voltages of the individual cells with a predetermined reference voltage;

a mode terminal for receiving a signal for designating a number of cells that are controlled by the power supply monitoring integrated circuit device;

a first circuit that can forcibly bring part of the comparing means into a predetermined output state in accordance with the signal received at the mode terminal; and a second circuit for excluding from monitoring the outputs of those comparing means which have been brought into the predetermined output state.

5. A power supply monitoring integrated circuit device as claimed in claim 4, characterized in that:

the reference voltage is an overdischarge voltage;

the comparing means each output a first level when the voltage of the corresponding cell is higher than the overdischarge voltage, and output a second level when the voltage of the corresponding cell is lower than the overdischarge voltage; and the second circuit for achieving exclusion from monitoring performs an AND operation on the outputs of the comparing means by means of an AND circuit, and forces part of the comparing means to output a first level in accordance with the signal received at the mode terminal by means of the first circuit for forcibly bringing about a predetermined output state.

6. A power supply monitoring integrated circuit device as claimed in claim 4, characterized in that:

the first circuit is an OR circuit that is connected to a particular comparing means and to the mode terminal so as to receive an output of the particular comparing means and the signal received at the mode terminal; and the second circuit is an AND circuit that receives an output of the OR circuit and outputs of the comparing means other than the particular comparing means.

* * * * *